(12) United States Patent
Apurva et al.

(10) Patent No.: US 12,110,585 B2
(45) Date of Patent: Oct. 8, 2024

(54) PROCESS CHAMBER AND EXHAUST LINER SYSTEM THEREFOR

(71) Applicant: APPLIED MATERIALS, INC., Santa Clara, CA (US)

(72) Inventors: Naman Apurva, Bangalore (IN); Lara A. Hawrylchak, San Jose, CA (US); Mahesh Ramakrishna, Bangalore (IN); Sriharish Srinivasan, Bangalore (IN); Prashant Agarwal, Bangalore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 235 days.

(21) Appl. No.: 17/167,469

(22) Filed: Feb. 4, 2021

(65) Prior Publication Data
US 2021/0249239 A1    Aug. 12, 2021

Related U.S. Application Data

(60) Provisional application No. 62/972,535, filed on Feb. 10, 2020.

(51) Int. Cl.
*C23C 16/44*    (2006.01)
*C23C 16/455*   (2006.01)
*C23C 16/458*   (2006.01)
(Continued)

(52) U.S. Cl.
CPC .... *C23C 16/4412* (2013.01); *C23C 16/45517* (2013.01); *C23C 16/45591* (2013.01);
(Continued)

(58) Field of Classification Search
CPC ............ C23C 16/4408; C23C 16/4412; C23C 16/45508; C23C 16/45517;
(Continued)

(56) References Cited

U.S. PATENT DOCUMENTS 5,855,681 A * 1/1999 Maydan ............ H01L 21/67742
                                                204/298.25
5,968,379 A * 10/1999 Zhao ................... C23C 16/4586
                                                219/121.52
(Continued)

FOREIGN PATENT DOCUMENTS

CN    108950518 A    12/2018

OTHER PUBLICATIONS

International Search Report for PCT/US2021/016605, dated May 27, 2021.

*Primary Examiner* — Kurt Sweely
(74) *Attorney, Agent, or Firm* — MOSER TABOA

(57) ABSTRACT

Embodiments of exhaust liner systems are provided herein. In some embodiments, an exhaust liner system for use in a process chamber includes a lower exhaust liner having an annular body with a central opening; an upper flange, a central flange, and a lower flange extending outward from the annular body, wherein the lower flange and the central flange partially define a first plenum, and wherein the central flange and the upper flange partially define a second plenum; a plurality of exhaust holes from the central opening to the first plenum; and at least one cutout in the central flange to provide a flow path from the first plenum to the second plenum, wherein the lower exhaust liner defines a gas flow path from the central opening to the first plenum via the plurality of exhaust holes and from the first plenum to the second plenum via the least one cutout.

19 Claims, 4 Drawing Sheets

(51) Int. Cl.
*H01J 37/32* (2006.01)
*H01L 21/67* (2006.01)

(52) U.S. Cl.
CPC .... *C23C 16/4585* (2013.01); *C23C 16/45565* (2013.01); *H01J 37/3244* (2013.01); *H01J 37/32633* (2013.01); *H01J 37/32834* (2013.01); *H01L 21/67069* (2013.01)

(58) Field of Classification Search
CPC .......... C23C 16/45565; C23C 16/4558; C23C 16/45591; C23C 16/4585; C23C 16/505–511; H01J 37/32091; H01J 37/321; H01J 37/32431–32449; H01J 37/32495; H01J 37/32623–32642; H01J 37/32715; H01J 37/32834; H01J 37/32853–32871; H01J 37/32889; H01J 37/32899; H01L 21/67069; H01L 21/67155; H01L 21/67161; H01L 21/6719; H01L 21/68714
See application file for complete search history.

(56) References Cited

U.S. PATENT DOCUMENTS

| | | | | |
|---|---|---|---|---|
| 6,117,244 | A * | 9/2000 | Bang | C23C 16/4401 |
| | | | | 156/914 |
| 6,120,605 | A * | 9/2000 | Sato | C23C 16/4401 |
| | | | | 118/725 |
| 6,170,429 | B1 * | 1/2001 | Schoepp | H01J 37/32495 |
| | | | | 118/723 R |
| 8,118,938 | B2 * | 2/2012 | Carducci | H01J 37/32623 |
| | | | | 118/728 |
| 2004/0144787 | A1 | 7/2004 | Goto et al. | |
| 2005/0196971 | A1 | 9/2005 | Sen et al. | |
| 2005/0205110 | A1 * | 9/2005 | Kao | C23C 14/022 |
| | | | | 134/1.1 |
| 2014/0224174 | A1 | 8/2014 | Abedijaber et al. | |
| 2015/0059081 | A1 | 3/2015 | Huston et al. | |
| 2015/0176123 | A1 | 6/2015 | Carlson et al. | |

\* cited by examiner

PROCESS CHAMBER AND EXHAUST LINER SYSTEM THEREFOR

CROSS-REFERENCE TO RELATED APPLICATIONS

This application claims benefit of U.S. provisional patent application Ser. No. 62/972,535, filed Feb. 10, 2020 which is herein incorporated by reference in its entirety.

FIELD

Embodiments of the present disclosure generally relate to semiconductor processing and, more particularly, to apparatus for processing substrates.

BACKGROUND

Conventional process chambers that utilize a single pump to exhaust process gases from a side of the process chamber can lead to process non-uniformities (for example, non-uniform etch rates in an etch chamber or other non-uniform on-substrate processing results) due, at least in part, to non-uniform flow of process gases in the process chamber. As the critical dimensions for semiconductor devices continue to shrink, process non-uniformities due to this effect are exacerbated by an increased need for more uniformly processed substrates.

Thus, the inventors have provided improved methods and apparatus for processing substrates that can provide improved process uniformity.

SUMMARY

Embodiments of exhaust liner systems are provided herein. In some embodiments, an exhaust liner system for use in a process chamber includes a lower exhaust liner having an annular body with a central opening; an upper flange, a central flange, and a lower flange extending outward from the annular body, wherein the lower flange and the central flange partially define a first plenum, and wherein the central flange and the upper flange partially define a second plenum; a plurality of exhaust holes disposed through the annular body from the central opening to the first plenum; and at least one cutout in the central flange to provide a flow path from the first plenum to the second plenum, wherein the lower exhaust liner defines a gas flow path from the central opening to the first plenum via the plurality of exhaust holes and from the first plenum to the second plenum via the least one cutout.

In some embodiments, an exhaust liner system for use in a process chamber includes a lower exhaust liner having an annular body with a central opening, a plurality of exhaust holes disposed through sidewalls of the annular body, wherein the plurality of exhaust holes are fluidly coupled to a first plenum partially defined by an outer surface of the annular body, and wherein the first plenum is fluidly coupled to a second plenum partially defined by the outer surface of the annular body via a least one cutout; and an upper exhaust liner having an annular body disposed on the lower exhaust liner, wherein the second plenum of the lower exhaust liner is fluidly coupled to a third plenum disposed between the lower exhaust liner and the upper exhaust liner along an outer surface of the annular body of the upper exhaust liner.

In some embodiments, a process chamber includes a chamber body and a lid disposed on the chamber body to define an interior volume therein; a substrate support disposed in the interior volume; a showerhead disposed in the interior volume opposite the substrate support; a lower exhaust liner disposed about the substrate support having an annular body with a central opening, a plurality of exhaust holes disposed through sidewalls of the annular body, and two or more plenums fluidly coupled to the plurality of exhaust holes; and an upper exhaust liner having an annular body disposed on the lower exhaust liner, wherein the two or more plenums of the lower exhaust liner are fluidly coupled to a plenum disposed between the lower exhaust liner and the upper exhaust liner.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
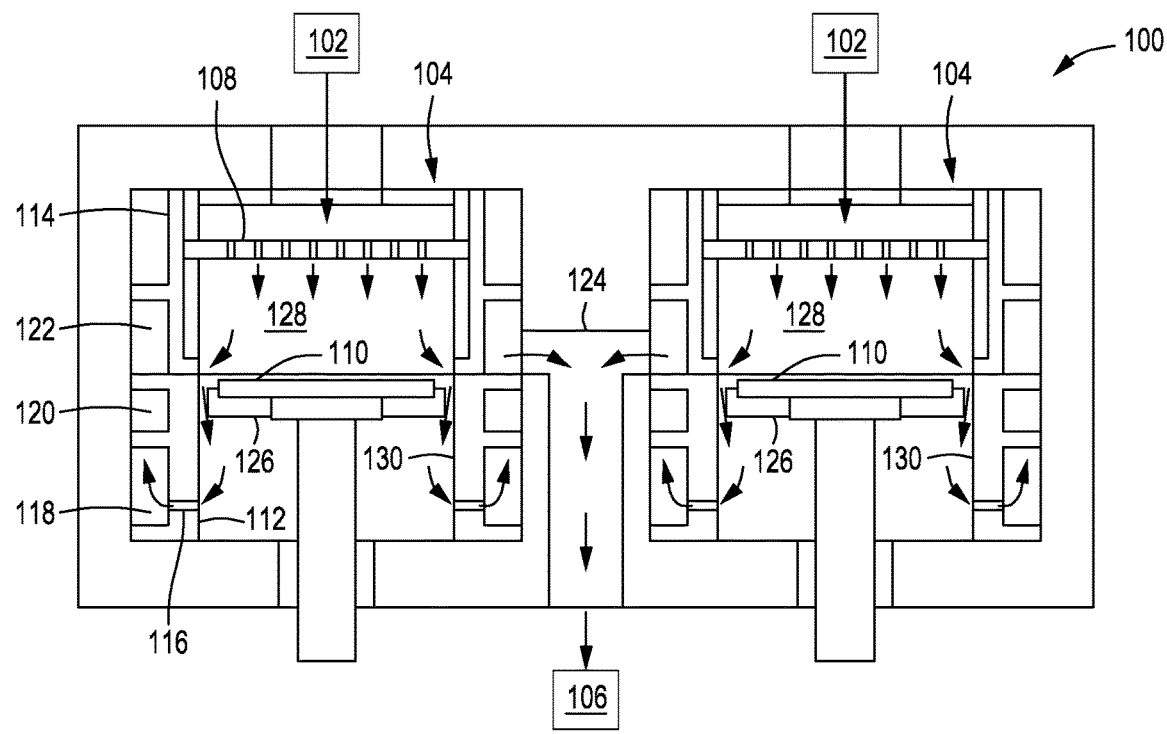
FIG. 1 depicts a schematic cross-sectional side view of an apparatus for processing substrates in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of the present disclosure generally relate to methods and apparatus for improving flow uniformity across a substrate, such as a semiconductor substrate, in a substrate processing chamber. The more uniform flow of process gases within the process chamber may advantageously facilitate more uniform flow of gases proximate the surface of a substrate, thereby facilitating more uniform processing of the substrate. The inventive apparatus may be utilized in any suitable process chamber having asymmetric pumping of exhaust. Suitable commercially available process chambers may include any of the PRODUCER® or other lines of process chambers, available from Applied Materials, Inc. of Santa Clara, California, or other manufacturers. Other suitable chambers include any chambers that may require substantially uniform pressure, flow, and/or residence time of process gases flowing therethrough, or uniform plasma processing, including chambers having symmetrically arranged pumping ports.

FIG. 1 depicts a schematic cross-sectional side view of an apparatus (e.g., processing system 100) for processing substrates in accordance with at least some embodiments of the present disclosure. The processing system 100 may be utilized with a process chamber 104 (two process chambers 104 depicted in FIG. 1) having a symmetric or, as shown, an asymmetric, or offset exhaust system for removing excess process gases, processing by-products, or the like, from the interior of the process chamber 104 (offset exhaust port 124 depicted in FIG. 1). The process chamber 104 includes an interior volume 128 therein. A substrate support 110 is disposed in the interior volume 128 to support a substrate. A showerhead 108 is disposed in the interior volume 128 opposite the substrate support 110 to supply a flow of gas to a processing volume disposed between the showerhead 108 and the substrate support 110. The process chamber 104 includes a slit valve 126 configured to facilitate placing and removing a substrate from a support surface of the substrate support 110.

During use, one or more process gases are introduced into the process chamber 104 from a gas source 102. The one or more process gases flow through the showerhead 108 over a substrate disposed on the substrate support 110 and then towards the exhaust port 124 on a side of the process chamber 104 to a pump 106. Due to the exhaust port 124 located at one side of the process chamber, the gas flow has a skew in the velocity profile towards the exhaust port 124. The skew in the velocity profile in turn leads to non-uniform radial concentration of the process gas on the substrate surface, leading to non-uniform processing of the substrate across the substrate surface. An exhaust liner system 130 disposed in the interior volume 128 and about the substrate support 110 has defines a gas flow path that advantageously reduces or prevents the skew in the velocity profile of the gas flow in the interior volume 128 to improve process uniformity. The exhaust liner system 130 also advantageously improves chamber matching between two process chambers 104 in a multi-chamber processing system (as shown in FIG. 1). Although described herein with respect to a multi-chamber processing system as shown in FIG. 1, embodiments of the present disclosure may also be used in individual process chambers that are not part of a multi-chamber processing system.

In some embodiments, the exhaust liner system 130 includes a lower exhaust liner 112 and an upper exhaust liner 114 disposed on the lower exhaust liner 112. The lower exhaust liner 112 includes an annular body having a central opening. The lower exhaust liner 112 includes a plurality of exhaust holes 116 disposed through sidewalls of the annular body. In some embodiments, the plurality of exhaust holes 116 are spaced at regular angular intervals about a longitudinal axis of the lower exhaust liner 112. The plurality of exhaust holes 116 determine the flow distribution of the process gases at the bottom of the interior volume 128, which impacts the flow distribution at a top surface of the substrate. Two or more plenums fluidly couple the plurality of exhaust holes 116 to the exhaust port 124. For example, in some embodiments, the lower exhaust liner 112 includes or partially defines a first plenum 118 fluidly coupled to the plurality of exhaust holes 116 and a second plenum 120 fluidly coupled to the first plenum 118. For example, the first plenum 118 and the second plenum 120 can be partially defined by annular channels disposed along the outer surface of the lower exhaust liner 112, such that the first plenum 118 and the second plenum 120 are fully defined by the annular channels along with the chamber wall when the lower exhaust liner 112 is inserted in the process chamber 104.

In some embodiments, the upper exhaust liner 114 having an annular shape is disposed on the lower exhaust liner 112. In some embodiments, a third plenum 122 is disposed between the lower exhaust liner 112 and the upper exhaust liner 114. The third plenum 122 fluidly couples the second plenum 120 to the exhaust port 124. In some embodiments, the gas flow path that advantageously reduces or prevents the skew of the gas flow distribution at the top surface of the substrate extends through the plurality of exhaust holes 116 through the first plenum 118, through the second plenum 120, and to the third plenum 122.

Figure 2:
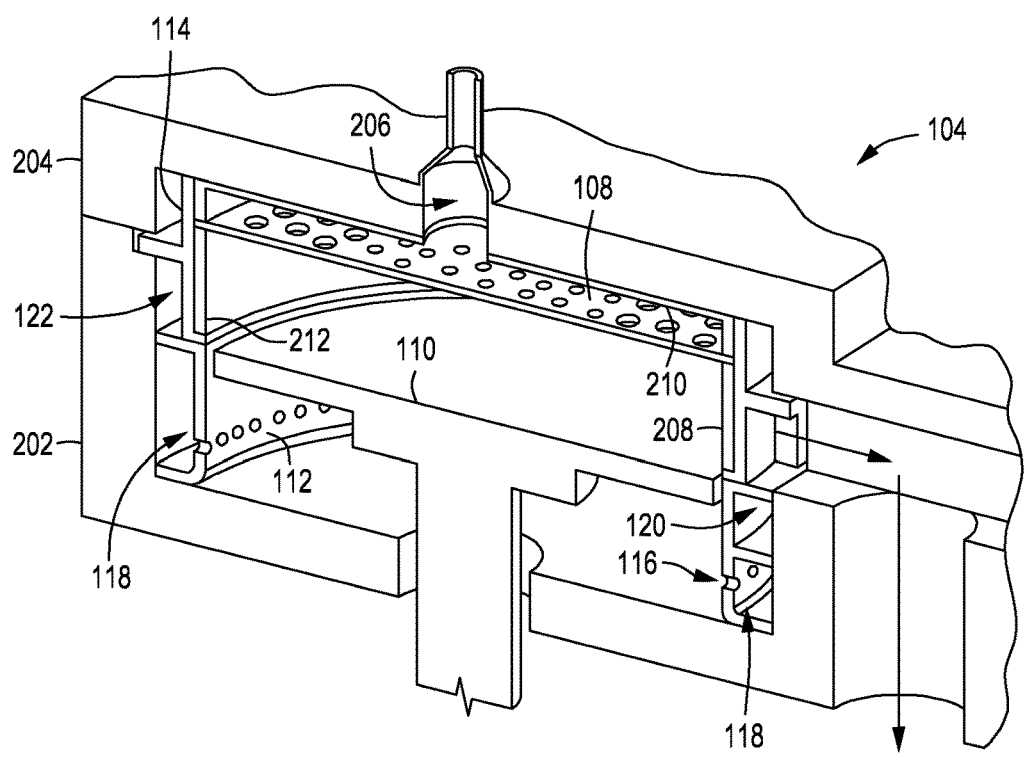
FIG. 2 depicts an isometric cross-sectional side view of an apparatus for processing substrates in accordance with at least some embodiments of the present disclosure.

FIG. 2 depicts an isometric cross-sectional side view of an apparatus for processing substrates (e.g., process chamber 104) in accordance with at least some embodiments of the present disclosure. The process chamber 104 generally comprises a chamber body 202 and a chamber lid 204 disposed on the chamber body 202 to define the interior volume 128. The process chamber 104 includes a gas supply port 206 disposed in the chamber lid 204 of the process chamber to supply process gas (e.g., from the gas source 102) into the process chamber 104. In some embodiments, a process kit 208 is disposed within the upper exhaust liner 114. In some embodiments, the upper exhaust liner 114 includes a lower lip 212 to support a chamber component, for example, the process kit 208. In some embodiments, the showerhead 108 rests on an upper surface of the process kit 208. In some embodiments, a process kit cap 210 is disposed on a peripheral edge of the showerhead 108. The process kit 208 and the process kit cap 210 are configured to support the showerhead 108 and protect the inner walls of the chamber lid 204. The process kit cap 210 includes an opening aligned with the gas supply port 206 to allow the process gas to flow therethrough.

Figure 3:
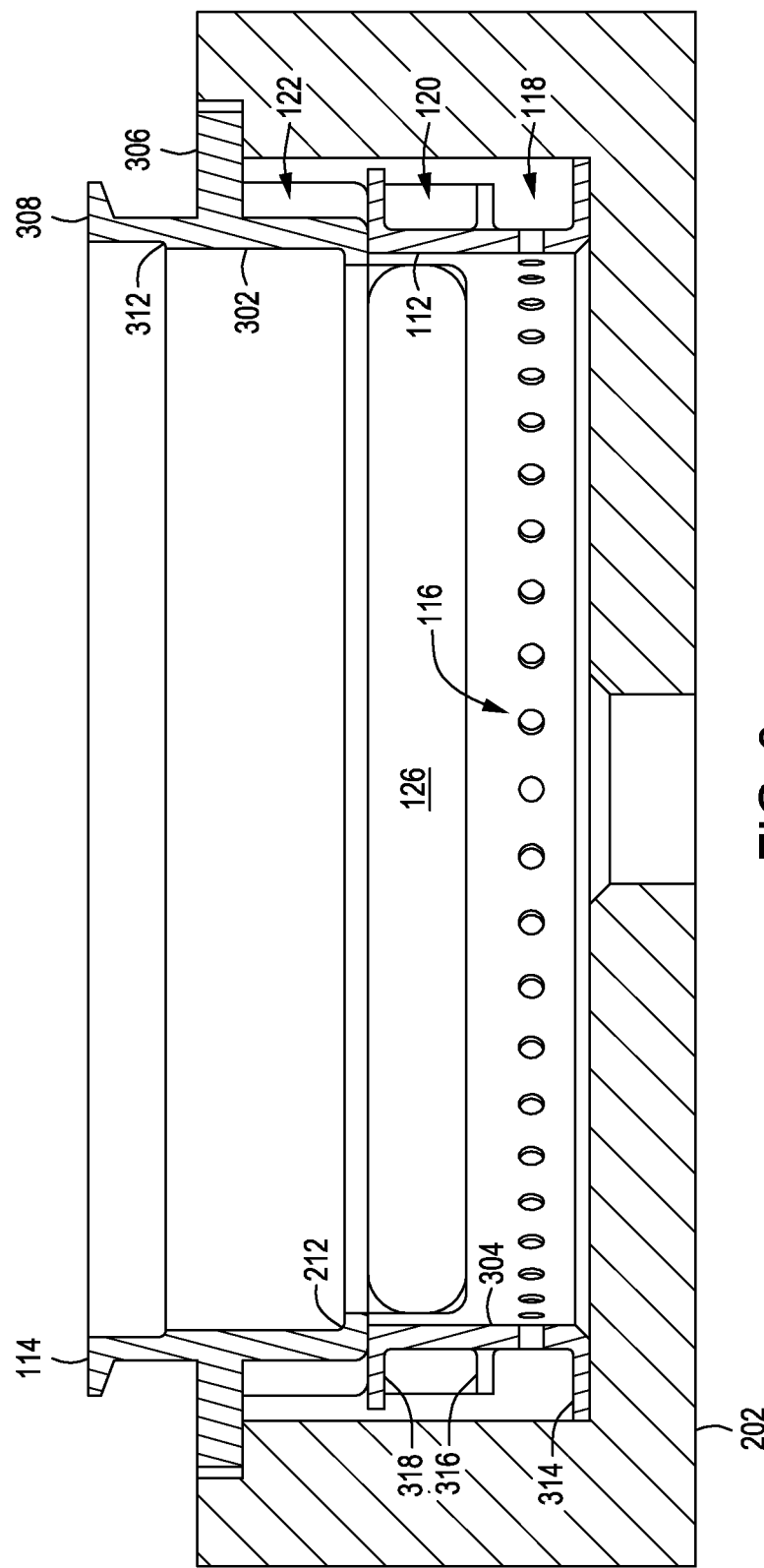
FIG. 3 depicts a schematic cross-sectional side view of a portion of an apparatus for processing substrates in accordance with at least some embodiments of the present disclosure.

FIG. 3 depicts a schematic cross-sectional side view of a portion of an apparatus for processing substrates in accordance with at least some embodiments of the present disclosure. In some embodiments, the lower exhaust liner 112 includes an annular body 304 having a central opening. In some embodiments, the lower exhaust liner 112 includes a lower flange 314 that extends radially outward from the annular body 304. In some embodiments, the lower exhaust liner 112 includes an upper flange 318 that extends radially outward form the annular body 304. In some embodiments, the lower exhaust liner 112 includes a central flange 316 that extends radially outward from the annular body 304 and between the upper flange 318 and the lower flange 314. In some embodiments, the lower flange 314 and the central flange 316, together with the chamber body 202, define the first plenum 118. In some embodiments, the upper flange 318 and the central flange 316, together with the chamber body 202, define the second plenum 120. In some embodiments, an outer diameter of the central flange 316 is similar to an outer diameter of the lower flange 314 and the upper flange 318.

In some embodiments, the plurality of exhaust holes 116 may vary in diameter to advantageously evacuate the interior volume 128 in a more uniform manner through the plurality of exhaust holes 116. The slit valve 126 is generally disposed about 90 degrees from the exhaust port 124. In some embodiments, the plurality of exhaust holes 116 proximate the exhaust port 124 and diametrically opposed to the exhaust port 124 have a diameter smaller than a diameter of the plurality of exhaust holes 116 proximate the slit valve 126 and diametrically opposed to the slit valve 126 to achieve more uniform mass flow through the plurality of exhaust holes 116. In some embodiments, the plurality of exhaust holes 116 have a diameter of about 0.15 inches to about 0.40 inches.

In some embodiments, the upper exhaust liner 114 includes an annular body 302 having a central opening. In some embodiments, the upper exhaust liner 114 includes a flange 306 that extends radially outward from the annular body 302. In some embodiments, the flange 306 rests on chamber body 202. In some embodiments, the flange 306 has an outer diameter greater than an outer diameter of the lower exhaust liner 112. The flange 306, along with the upper flange 318 of the lower exhaust liner 112 and the chamber body 202, at least partially define the third plenum 122. For example, the third plenum 122 can be partially defined by an annular channel defined by the flange 306, the upper flange 318, and the outer sidewall of the upper exhaust liner 114, and fully defined by the annular channel along with the wall of the process chamber 104 when the upper exhaust liner 114 is inserted in the process chamber 104. In some embodiments, the upper exhaust liner 114 includes upper tabs 308 that extend radially outward form the annular body 304. The upper tabs 308 are configured to aid in handling the upper exhaust liner 114. In some embodiments, the upper exhaust liner 114 includes an inner ledge 312 configured to support a showerhead (e.g., showerhead 108).

Figure 4:
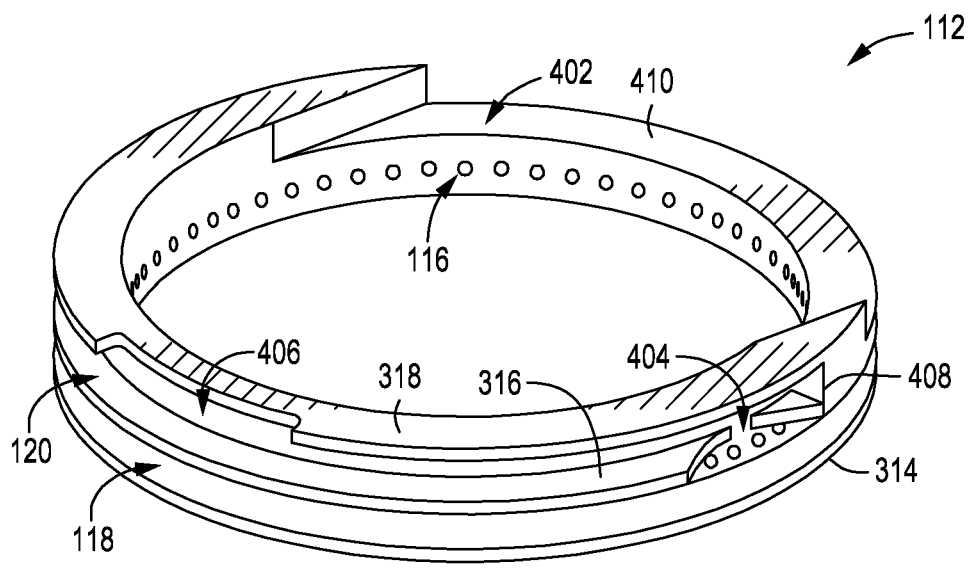
FIG. 4 depicts a top isometric view of a lower exhaust liner for use in an apparatus for processing substrates in accordance with at least some embodiments of the present disclosure.
Figure 5:
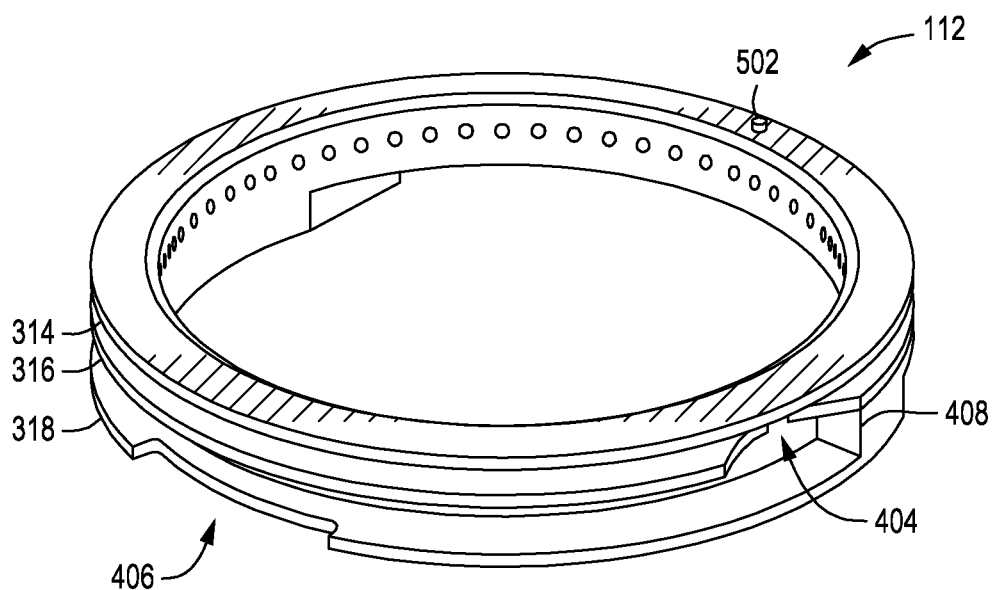
FIG. 5 depicts a bottom isometric view of a lower exhaust liner for use in an apparatus for processing substrates in accordance with at least some embodiments of the present disclosure.

FIG. 4 and FIG. 5 depict a top isometric view and a bottom isometric view, respectively, of the lower exhaust liner 112 for use in an apparatus for processing substrates in accordance with at least some embodiments of the present disclosure. The lower exhaust liner 112 includes a central opening 402. In some embodiments, the central flange 316 of the lower exhaust liner 112 includes at least one cutout 404 to direct a gas flow from the first plenum 118 to the second plenum 120. In some embodiments, the at least one cutout 404 comprises two cutouts. In some embodiments, the at least one cutout 404 comprises two cutouts that are diametrically opposed. In some embodiments, the plurality of exhaust holes 116 vary in size and exhaust holes proximate the at least one cutout 404 are smaller than exhaust holes away from the at least one cutout 404. In some embodiments, the at least one cutout 404 has a triangular shape, although other shapes can be used.

In some embodiments, the second plenum 120 is defined by the central flange 316, the upper flange 318 and a pair of stops 408 disposed between the central flange 316 and the upper flange 318. In some embodiments, each stop of the pair of stops 408 is disposed adjacent a corresponding one of the at least one cutout 404. In some embodiments, the upper flange 318 extends only partially about the annular body 304. In some embodiments, the upper flange 318 extends from the annular body 304 only between the pair of stops 408. In some embodiments, the lower exhaust liner 112 includes a slit valve cutout 410 between the pair of stops 408 on a side opposite the upper flange 318. The slit valve cutout 410 is disposed in an upper portion of the lower exhaust liner 112. For example, in some embodiments, the slit valve cutout 410 is disposed above the central flange 316 and extends upward from the central flange 316 such that the upper flange 318 extends from the annular body 304 only between the pair of stops 408 and terminates at opposite sides of the slit valve cutout 410. The slit valve cutout 410 is configured to be aligned with the slit valve 126 when the lower exhaust liner 112 is installed in the process chamber 104. In some embodiments, a surface of each of the pair of stops 408 that faces the slit valve cutout 410 is angled.

A lower surface of the lower exhaust liner 112 may include an alignment feature 502 to align the lower exhaust liner 112 with the chamber body 202 and the slit valve 126. For example, in some embodiments, the alignment feature 502 one or more dowels or pins (one shown in FIG. 5) that extends into corresponding openings in the chamber body 202.

In some embodiments, the upper flange 318 includes a slot 406 to direct a gas flow from the second plenum 120 to the third plenum 122. In some embodiments, the slot 406 is radially offset from the at least one cutout 404 of the central flange 316. In some embodiments, the slot 406 is centrally disposed in the upper flange 318, opposite the slit valve cutout 410. In some embodiments, where the at least one cutout 404 comprises two cutouts, the slot 406 is disposed equidistant from each of the two cutouts to evacuate the second plenum 120 in a more uniform manner.

Figure 6:
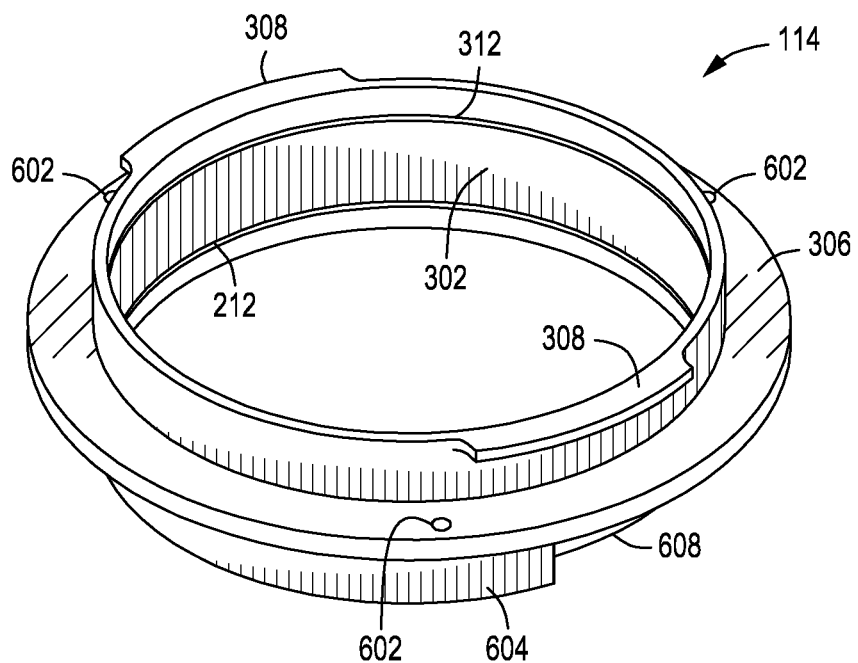
FIG. 6 depicts a top isometric view of an upper exhaust liner for use in an apparatus for processing substrates in accordance with at least some embodiments of the present disclosure.
Figure 7:
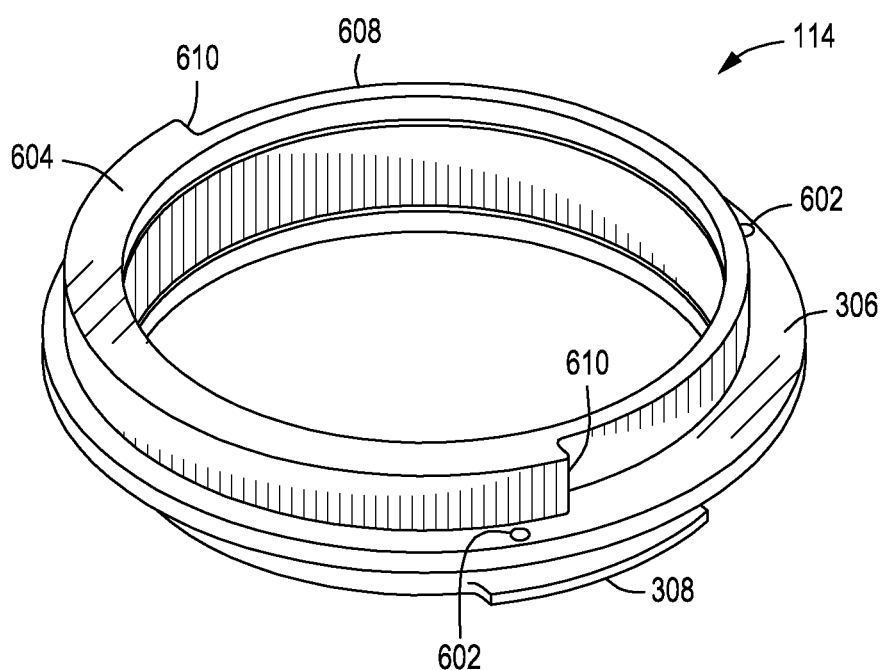
FIG. 7 depicts a bottom isometric view of an upper exhaust liner for use in an apparatus for processing substrates in accordance with at least some embodiments of the present disclosure.

FIG. 6 and FIG. 7 depict a top isometric view and a bottom isometric view, respectively, of an upper exhaust liner 114 for use in an apparatus for processing substrates in accordance with at least some embodiments of the present disclosure. In some embodiments, the flange 306 of the upper exhaust liner 114 includes a plurality of alignment features 602 for aligning the upper exhaust liner to the chamber body 202. In some embodiments, the plurality of alignment features 602 are openings configured to facilitate fastening the upper exhaust liner to the chamber body 202.

The upper exhaust liner 114 includes a lower portion between the flange 306 and the lower surface (side opposite the upper tabs 308) of the upper exhaust liner 114. In some embodiments, the annular body 302 of the upper exhaust liner 114 at the lower portion includes a first part 604 and a second part 608. The first part 604 has a wall thickness greater than a wall thickness of the second part 608 such that an outer diameter of the first part 604 is greater than an outer diameter of the second part 608. The first part 604 and the second part 608 define a pair of stop surfaces 610 at an interface between the first part 604 and the second part 608. In some embodiments, the third plenum 122 is defined between the pair of stop surfaces 610 along an outer surface of the second part 608.

While the foregoing is directed to embodiments of the present disclosure, other and further embodiments of the disclosure may be devised without departing from the basic scope thereof.

The invention claimed is:

1. An exhaust liner system for use in a process chamber, comprising:
   a lower exhaust liner having a longitudinal axis and an annular body with a longitudinally-extending innermost sidewall that defines a central opening of the annular body;
   an upper flange, a central flange, and a lower flange extending outward from the annular body, wherein the lower flange and the central flange partially define a first plenum, and wherein the central flange and the upper flange partially define a second plenum;
   a plurality of exhaust holes disposed through the longitudinally-extending innermost sidewall from the central opening to the first plenum; and at least one cutout in the central flange to provide a flow path from the first plenum to the second plenum, wherein the lower exhaust liner defines a gas flow path from the central opening to the first plenum via the plurality of exhaust holes and from the first plenum to the second plenum via the at least one cutout; and an upper exhaust liner having an annular body disposed on the upper flange of the lower exhaust liner, wherein the upper exhaust liner and the lower exhaust liner partially define a third plenum therebetween.

2. The exhaust liner system of claim 1, wherein the at least one cutout of the central flange comprises two cutouts that are diametrically opposed.

3. The exhaust liner system of claim 1, wherein the upper flange extends only partially about the annular body, and wherein the second plenum extends only partially about the central opening and is further partially defined by a pair of stops disposed between the central flange and the upper flange.

4. The exhaust liner system of claim 3, wherein the lower exhaust liner includes a slit valve cutout on a side opposite the upper flange.

5. The exhaust liner system of claim 1, wherein the upper flange includes a slot that is radially offset from the at least one cutout of the central flange.

6. The exhaust liner system of claim 1, wherein the plurality of exhaust holes vary in size.

7. The exhaust liner system of claim 1, wherein a lower portion of the upper exhaust liner includes a first part and a second part, wherein a wall thickness of the first part is greater than a wall thickness of the second part.

8. The exhaust liner system of claim 1, further comprising:
a slit valve cutout in a side of an upper portion of the lower exhaust liner, wherein the upper flange extends only partially about the annular body from one side of the slit valve cutout to an opposite side of the slit valve cutout, wherein the second plenum extends only partially about the central opening and is further partially defined by a pair of stops disposed between the central flange and the upper flange, wherein the at least one cutout of the central flange comprises two cutouts that are diametrically opposed, and wherein the upper flange includes a slot radially offset from the two cutouts of the central flange on a side opposite the slit valve cutout.

9. An exhaust liner system for use in a process chamber, comprising:
a lower exhaust liner having a longitudinal axis and an annular body with a longitudinally-extending innermost sidewall that defines a central opening of the annular body, a plurality of exhaust holes disposed through the longitudinally-extending innermost sidewall of the annular body to the central opening, wherein the plurality of exhaust holes are fluidly coupled to a first plenum partially defined by an outer surface of the annular body, and wherein the first plenum is fluidly coupled to a second plenum partially defined by the outer surface of the annular body via a least one cutout; and an upper exhaust liner having an annular body disposed on the lower exhaust liner, wherein the second plenum of the lower exhaust liner is fluidly coupled to a third plenum disposed between the lower exhaust liner and the upper exhaust liner along an outer surface of the annular body of the upper exhaust liner.

10. The exhaust liner system of claim 9, wherein the first plenum is disposed between a central flange and a lower flange of the lower exhaust liner.

11. The exhaust liner system of claim 9, wherein the upper exhaust liner includes a flange to at least partially define the third plenum.

12. The exhaust liner system of claim 9, wherein an upper flange, a central flange, and a lower flange extend outward from the annular body of the lower exhaust liner, wherein the lower flange and the central flange define the first plenum, wherein the central flange and the upper flange define the second plenum.

13. The exhaust liner system of claim 9, wherein the upper exhaust liner includes a lower lip to support a chamber component.

14. A process chamber, comprising:
a chamber body and a lid disposed on the chamber body to define an interior volume therein;
a substrate support disposed in the interior volume;
a showerhead disposed in the interior volume opposite the substrate support;
a lower exhaust liner disposed about the substrate support, the lower exhaust liner having a longitudinal axis and an annular body with a longitudinally-extending innermost sidewall that defines a central opening of the annular body, a plurality of exhaust holes disposed through the longitudinally-extending innermost sidewall of the annular body to the central opening, and two or more plenums fluidly coupled to the plurality of exhaust holes; and
an upper exhaust liner having an annular body disposed on the lower exhaust liner, wherein the two or more plenums of the lower exhaust liner are fluidly coupled to a plenum disposed between the lower exhaust liner and the upper exhaust liner.

15. The process chamber of claim 14, wherein the showerhead is disposed on an inner ledge of the upper exhaust liner.

16. The process chamber of claim 14, further comprising a process kit disposed in the upper exhaust liner and resting on a lower lip of the upper exhaust liner, wherein the showerhead rests on the process kit.

17. The process chamber of claim 14, wherein the lower exhaust liner includes an alignment feature to align the lower exhaust liner with the chamber body.

18. The process chamber of claim 14, wherein the upper exhaust liner includes a plurality of alignment features for aligning the upper exhaust liner to the chamber body.

19. The process chamber of claim 14, further comprising an exhaust port disposed on a side of the process chamber.

* * * * *